United States Patent
Khlat

(10) Patent No.: US 12,063,018 B2
(45) Date of Patent: Aug. 13, 2024

(54) ENVELOPE TRACKING INTEGRATED CIRCUIT OPERABLE WITH MULTIPLE TYPES OF POWER AMPLIFIERS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 467 days.

(21) Appl. No.: 17/343,912

(22) Filed: Jun. 10, 2021

(65) Prior Publication Data

US 2022/0399861 A1    Dec. 15, 2022

(51) Int. Cl.
*H03F 3/24*     (2006.01)
*H03F 1/02*     (2006.01)
*H03F 3/195*    (2006.01)

(52) U.S. Cl.
CPC ........... *H03F 3/245* (2013.01); *H03F 1/0233* (2013.01); *H03F 1/0288* (2013.01); *H03F 3/195* (2013.01); *H03F 2200/102* (2013.01); *H03F 2200/451* (2013.01)

(58) Field of Classification Search
CPC ........ H03F 3/245; H03F 3/195; H03F 1/0288; H03F 1/0233
See application file for complete search history.

(56) References Cited

U.S. PATENT DOCUMENTS

| | | | |
|---|---|---|---|
| 5,510,753 | A | 4/1996 | French |
| 5,838,732 | A | 11/1998 | Carney |
| 6,107,862 | A | 8/2000 | Mukainakano et al. |
| 6,141,377 | A | 10/2000 | Sharper et al. |
| 6,141,541 | A | 10/2000 | Midya et al. |
| 6,411,531 | B1 | 6/2002 | Nork et al. |
| 6,985,033 | B1 | 1/2006 | Shirali et al. |
| 7,043,213 | B2 | 5/2006 | Robinson et al. |
| 7,193,467 | B2 | 3/2007 | Garlepp et al. |
| 7,471,155 | B1 | 12/2008 | Levesque |

(Continued)

FOREIGN PATENT DOCUMENTS

| | | |
|---|---|---|
| CN | 103916093 A | 7/2014 |
| CN | 105322894 A | 2/2016 |

(Continued)

OTHER PUBLICATIONS

First Office Action for Chinese Patent Application No. 202010083654.0, dated May 12, 2023, 17 pages.

(Continued)

*Primary Examiner* — Patricia T Nguyen
(74) *Attorney, Agent, or Firm* — Withrow & Terranova, P.L.L.C.

(57) ABSTRACT

An envelope tracking (ET) integrated circuit (ETIC) operable with multiple types of power amplifiers is provided. The ETIC is configured to provide one or more ET voltages to a power amplifier(s) for amplifying a radio frequency (RF) signal. In embodiments disclosed herein, the ETIC can be configured to generate the ET voltages at same or different voltage levels based on specific types of the power amplifier(s), such as multi-stage power amplifier and Doherty power amplifier, and for a wider modulation bandwidth of the RF signal. As such, the ETIC can be flexibly adapted to enable a variety of power management scenarios and/or topologies.

19 Claims, 7 Drawing Sheets

(56) References Cited

U.S. PATENT DOCUMENTS

| | | |
|---|---|---|
| 7,570,931 B2 | 8/2009 | McCallister et al. |
| 7,994,862 B1 | 8/2011 | Pukhovski |
| 8,461,928 B2 | 6/2013 | Yahav et al. |
| 8,493,141 B2 | 7/2013 | Khlat et al. |
| 8,519,788 B2 | 8/2013 | Khlat |
| 8,588,713 B2 | 11/2013 | Khlat |
| 8,718,188 B2 | 5/2014 | Balteanu et al. |
| 8,723,492 B2 | 5/2014 | Korzeniowski |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,942,651 B2 * | 1/2015 | Jones ............ H03F 1/0261 |
| | | 455/127.1 |
| 8,947,161 B2 | 2/2015 | Khlat et al. |
| 8,989,682 B2 | 3/2015 | Ripley et al. |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,362,868 B2 | 6/2016 | Al-Qaq et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,705,451 B2 | 7/2017 | Takenaka et al. |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,900,204 B2 | 2/2018 | Levesque et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,090,809 B1 | 10/2018 | Khlat |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,116,470 B2 | 10/2018 | Gu et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,361,744 B1 | 7/2019 | Khlat |
| 10,382,071 B2 | 8/2019 | Rozek et al. |
| 10,476,437 B2 | 11/2019 | Nag et al. |
| 10,756,675 B2 | 8/2020 | Leipold et al. |
| 10,862,431 B1 | 12/2020 | Khlat |
| 10,879,804 B2 | 12/2020 | Kim et al. |
| 11,050,433 B1 | 6/2021 | Melanson et al. |
| 11,121,684 B2 | 9/2021 | Henzler et al. |
| 11,128,261 B2 | 9/2021 | Ranta et al. |
| 2002/0167827 A1 | 11/2002 | Umeda et al. |
| 2003/0107428 A1 | 6/2003 | Khouri et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0036212 A1 | 2/2007 | Leung et al. |
| 2007/0052474 A1 | 3/2007 | Saito |
| 2007/0258602 A1 | 11/2007 | Vepsalainen et al. |
| 2007/0290748 A1 | 12/2007 | Woo et al. |
| 2008/0116960 A1 | 5/2008 | Nakamura |
| 2008/0231358 A1 | 9/2008 | Maemura |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0283534 A1 | 11/2010 | Pierdomenico |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0148705 A1 | 6/2011 | Kenington |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0281597 A1 | 11/2012 | Khlat et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0072139 A1 | 3/2013 | Kang et al. |
| 2013/0100991 A1 | 4/2013 | Woo |
| 2013/0127548 A1 | 5/2013 | Popplewell et al. |
| 2013/0130724 A1 | 5/2013 | Kumar Reddy et al. |
| 2013/0141064 A1 | 6/2013 | Kay et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 | 2/2014 | Khlat et al. |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0169427 A1 | 6/2014 | Asenio et al. |
| 2014/0184335 A1 | 7/2014 | Nobbe et al. |
| 2014/0199949 A1 | 7/2014 | Nagode et al. |
| 2014/0203869 A1 | 7/2014 | Khlat et al. |
| 2014/0210550 A1 | 7/2014 | Mathe et al. |
| 2014/0213196 A1 | 7/2014 | Langer et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0155836 A1 | 6/2015 | Midya et al. |
| 2015/0188432 A1 | 7/2015 | Vannorsdel et al. |
| 2015/0234402 A1 | 8/2015 | Kay et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0236877 A1 | 8/2015 | Peng et al. |
| 2015/0280652 A1 | 10/2015 | Cohen |
| 2015/0333781 A1 | 11/2015 | Alon et al. |

(56) References Cited

U.S. PATENT DOCUMENTS

| | | |
|---|---|---|
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1 | 4/2016 | Perreault et al. |
| 2016/0099687 A1 | 4/2016 | Khlat |
| 2016/0105151 A1* | 4/2016 | Langer ............... H04B 1/0475 330/295 |
| 2016/0118941 A1 | 4/2016 | Wang |
| 2016/0126900 A1 | 5/2016 | Shute |
| 2016/0164550 A1 | 6/2016 | Pilgram |
| 2016/0164551 A1 | 6/2016 | Khlat et al. |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0249300 A1 | 8/2016 | Tsai et al. |
| 2016/0294587 A1 | 10/2016 | Jiang et al. |
| 2017/0005619 A1 | 1/2017 | Khlat |
| 2017/0005676 A1 | 1/2017 | Yan et al. |
| 2017/0006543 A1 | 1/2017 | Khlat |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0222175 A1 | 10/2019 | Khlat et al. |
| 2019/0319584 A1 | 10/2019 | Khlat et al. |
| 2019/0386565 A1 | 12/2019 | Rosolowski et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0127608 A1 | 4/2020 | Khlat |
| 2020/0127625 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0313622 A1 | 10/2020 | Eichler et al. |
| 2020/0321848 A1 | 10/2020 | Khlat |
| 2020/0321917 A1 | 10/2020 | Nomiyama et al. |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0350878 A1* | 11/2020 | Drogi ............... H04W 52/52 |
| 2020/0382061 A1 | 12/2020 | Khlat |
| 2020/0382066 A1 | 12/2020 | Khlat |
| 2021/0036604 A1 | 2/2021 | Khlat et al. |
| 2021/0099137 A1* | 4/2021 | Drogi ............... H03F 3/72 |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194515 A1 | 6/2021 | Go et al. |
| 2021/0194517 A1 | 6/2021 | Mirea et al. |
| 2021/0194522 A1 | 6/2021 | Stockert et al. |
| 2021/0211108 A1 | 7/2021 | Khlat |
| 2021/0226585 A1 | 7/2021 | Khlat |
| 2021/0234513 A1 | 7/2021 | Khlat |
| 2021/0265953 A1 | 8/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |
| 2021/0356299 A1 | 11/2021 | Park |
| 2022/0021348 A1* | 1/2022 | Philpott ............. H03F 3/72 |
| 2022/0103137 A1 | 3/2022 | Khlat et al. |
| 2022/0123698 A1 | 4/2022 | Goto et al. |
| 2022/0123744 A1 | 4/2022 | Khlat |
| 2022/0224294 A1 | 7/2022 | Khlat et al. |
| 2022/0263474 A1 | 8/2022 | Khlat |
| 2022/0278651 A1 | 9/2022 | Khlat |
| 2022/0286094 A1 | 9/2022 | Granger-Jones et al. |
| 2022/0385239 A1 | 12/2022 | Khlat |

FOREIGN PATENT DOCUMENTS

| | | |
|---|---|---|
| CN | 105680807 A | 6/2016 |
| CN | 106208974 A | 12/2016 |
| CN | 106209270 A | 12/2016 |
| CN | 106877824 A | 6/2017 |
| CN | 107093987 A | 8/2017 |
| CN | 108141184 A | 6/2018 |
| CN | 109150212 A | 1/2019 |
| EP | 3174199 A2 | 5/2012 |
| EP | 2909928 A1 | 8/2015 |
| JP | H03104422 A | 5/1991 |
| WO | 2018182778 A1 | 10/2018 |
| WO | 2020206246 A1 | 10/2020 |
| WO | 2021016350 A1 | 1/2021 |
| WO | 2021046453 A1 | 3/2021 |
| WO | 2022103493 A1 | 5/2022 |

OTHER PUBLICATIONS

Notification to Grant for Chinese Patent Application No. 202010097807.7, dated Jul. 11, 2023, 14 pages.

International Preliminary Report on Patentability for International Patent Application No. PCT/US2021/050892, dated Oct. 24, 2022, 20 pages.

Advisory Action for U.S. Appl. No. 17/073,764, dated May 26, 2023, 3 pages.

U.S. Appl. No. 16/834,049, filed Mar. 30, 2020.

U.S. Appl. No. 17/032,553, filed Sep. 25, 2020.

U.S. Appl. No. 17/073,764, filed Oct. 19, 2020.

U.S. Appl. No. 17/363,522, filed Jun. 30, 2021.

Written Opinion for International Patent Application No. PCT/US2021/052830, dated Nov. 3, 2022, 7 pages.

Notice of Allowance for U.S. Appl. No. 15/964,762, dated Mar. 18, 2019, 7 pages.

Non-Final Office Action for U.S. Appl. No. 16/263,316, dated Dec. 23, 2019, 10 pages.

Final Office Action for U.S. Appl. No. 16/263,316, dated May 13, 2020, 10 pages.

Non-Final Office Action for U.S. Appl. No. 16/263,316, dated Jul. 17, 2020, 4 pages.

Non-Final Office Action for U.S. Appl. No. 16/263,316, dated Nov. 24, 2020, 4 pages.

Notice of Allowance for U.S. Appl. No. 16/263,316, dated Mar. 30, 2021, 7 pages.

(56) References Cited

OTHER PUBLICATIONS

Final Office Action for U.S. Appl. No. 16/807,575, dated May 4, 2022, 12 pages.
Quayle Action for U.S. Appl. No. 16/589,940, dated Dec. 4, 2020, 8 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Notice of Allowance for U.S. Appl. No. 16/582,471, dated Jun. 22, 2021, 9 pages.
Non-Final Office Action for U.S. Appl. No. 16/597,952, dated May 26, 2021, 7 pages.
Notice of Allowance for U.S. Appl. No. 16/834,049, dated Jun. 24, 2021, 8 pages.
Notice of Allowance for U.S. Appl. No. 17/163,642, dated Mar. 1, 2023, 10 pages.
Final Office Action for U.S. Appl. No. 17/073,764, dated Mar. 3, 2023, 14 pages.
International Preliminary Report on Patentability for International Patent Application No. PCT/US2021/052830, dated Feb. 20, 2023, 21 pages.
Chen, S. et al., "A 4.5 µW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.
Ying, K. et al., "A Wideband Envelope Detector with Low Ripple and High Detection Speed," 2018 IEEE International Symposium on Circuits and Systems (ISCAS), May 27-30, 2018, IEEE, 5 pages.
Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Quayle Action for U.S. Appl. No. 16/855,154, dated Oct. 25, 2021, 6 pages.
Notice of Allowance for U.S. Appl. No. 17/115,982, dated Nov. 12, 2021, 8 pages.
Non-Final Office Action for U.S. Appl. No. 17/126,561, dated Oct. 14, 2021, 6 pages.
Non-Final Office Action for U.S. Appl. No. 17/073,764, dated Dec. 24, 2021, 22 pages.
International Search Report and Written Opinion for International Patent Application No. PCT/US2021/052151, dated Jan. 4, 2022, 16 pages.
Advisory Action for U.S. Appl. No. 16/807,575, dated Jul. 28, 2022, 3 pages.
Notice of Allowance for U.S. Appl. No. 16/807,575, dated Aug. 19, 2022, 8 pages.
Notice of Allowance for U.S. Appl. No. 17/148,064, dated Aug. 18, 2022, 8 pages.
Non-Final Office Action for U.S. Appl. No. 17/163,642, dated Aug. 17, 2022, 9 pages.
Final Office Action for U.S. Appl. No. 17/032,553, dated Jul. 29, 2022, 6 pages.
Final Office Action for U.S. Appl. No. 17/073,764, dated Jun. 1, 2022, 22 pages.
Advisory Action for U.S. Appl. No. 17/073,764, dated Aug. 23, 2022, 3 pages.
Extended European Search Report for European Patent Application No. 22153526.3, dated Jul. 13, 2022, 9 pages.
U.S. Appl. No. 17/579,796, filed Jan. 20, 2022.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Patent Application No. 15/704, 131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.

(56) References Cited

OTHER PUBLICATIONS

Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, dated Aug. 25, 2020, 5 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Notice of Allowance for U.S. Appl. No. 17/073,764, dated Aug. 23, 2023, 12 pages.
Notice of Allowance for U.S. Appl. No. 16/582,471, dated Feb. 1, 2022, 9 pages.
Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.
International Search Report and Written Opinion for International Patent Application No. PCT/US2021/054141 dated Jan. 25, 2022, 15 pages.
Non-Final Office Action for U.S. Appl. No. 17/032,553, dated Mar. 21, 2022, 4 pages.
International Search Report and Written Opinion for International Patent Application No. PCT/US2021/052830, dated Jan. 24, 2022, 13 pages.
International Preliminary Report on Patentability for International Patent Application No. PCT/US2021/052151, dated Oct. 13, 2022, 21 pages.
International Preliminary Report on Patentability for International Patent Application No. PCT/US2021/054141, dated Sep. 29, 2022, 20 pages.
Non-Final Office Action for U.S. Appl. No. 17/146,765, dated Sep. 7, 2022, 10 pages.
Final Office Action for U.S. Appl. No. 17/163,642, dated Nov. 25, 2022, 13 pages.
Notice of Allowance for U.S. Appl. No. 17/032,553, dated Oct. 11, 2022, 7 pages.
Non-Final Office Action for U.S. Appl. No. 17/073,764, dated Sep. 30, 2022, 13 pages.
Non-Final Office Action for U.S. Appl. No. 17/363,568, dated Nov. 9, 2023, 8 pages.
Decision to Grant for Chinese Patent Application No. 202010083654.0, dated Sep. 11, 2023, 8 pages.
Notification to Grant for Chinese Patent Application No. 202010083654.0, dated Nov. 9, 2023, 8 pages.
Notice of Allowance for U.S. Appl. No. 17/363,568, dated Jan. 3, 2024, 7 pages.
Quayle Action for U.S. Appl. No. 17/351,560, dated Nov. 24, 2023, 7 pages.
Notice of Allowance for U.S. Appl. No. 17/351,560, dated Jan. 4, 2024, 7 pages.
Examination Report for European Patent Application No. 21790723.7, mailed Mar. 7, 2024, 5 pages.
Non-Final Office Action for U.S. Appl. No. 17/331,996, mailed Feb. 1, 2024, 9 pages.
Notice of Allowance for U.S. Appl. No. 17/331,996, mailed Mar. 1, 2024, 8 pages.
Intention to Grant for European Patent Application No. 21806074.7, mailed May 10, 2024, 27 pages.
Notice of Allowance for U.S. Appl. No. 17/363,568, mailed Apr. 17, 2024, 6 pages.
Notice of Allowance for U.S. Appl. No. 17/351,560, mailed Apr. 19, 2024, 8 pages.
International Search Report and Written Opinion for International Patent Application No. PCT/US2023/085103, mailed Apr. 26, 2024, 17 pages.

* cited by examiner though the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device may be configured to transmit the RF signal(s) based on such spatial multiplexing/diversity schemes as multiple-input multiple-output (MIMO) and RF beamforming. As such, the 5G-NR mobile communication device typically employs a power management circuit(s) to drive a power amplifier(s) for amplifying the RF signal(s) before feeding the RF signal(s) to an antenna(s).

ENVELOPE TRACKING INTEGRATED CIRCUIT OPERABLE WITH MULTIPLE TYPES OF POWER AMPLIFIERS

FIELD OF THE DISCLOSURE

The technology of the disclosure relates generally to an envelope tracking (ET) integrated circuit (ETIC) capable of supporting multiple types of power amplifiers.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device may be configured to transmit the RF signal(s) based on such spatial multiplexing/diversity schemes as multiple-input multiple-output (MIMO) and RF beamforming. As such, the 5G-NR mobile communication device typically employs a power management circuit(s) to drive a power amplifier(s) for amplifying the RF signal(s) before feeding the RF signal(s) to an antenna(s).

Notably, the 5G-NR mobile communication device may include multiple types of power amplifiers (e.g., differential power amplifier, single-stage power amplifier, multi-stage power amplifier, balanced power amplifier, Doherty power amplifier, etc.), each adapted to and/or optimized for a specific type of application and/or transmission scheme. For example, a differential power amplifier or a multi-stage power amplifier is more efficient for amplifying a same RF signal for transmission based on a spatial diversity scheme, a balanced power amplifier will be better suited for amplifying different RF signals for transmission based on a spatial multiplexing scheme, and a Doherty power amplifier is more desirable for different load modulations. In this regard, it is desirable to flexibly configure the power management circuit(s) to efficiently support a variety of power amplifiers.

SUMMARY

Embodiments of the disclosure relate to an envelope tracking (ET) integrated circuit (ETIC) operable with multiple types of power amplifiers. The ETIC is configured to provide one or more ET voltages to a power amplifier(s) for amplifying a radio frequency (RF) signal. In embodiments disclosed herein, the ETIC can be configured to generate the ET voltages at same or different voltage levels based on specific types of the power amplifier(s), such as multi-stage power amplifier and Doherty power amplifier, and for a wider modulation bandwidth of the RF signal. As such, the ETIC can be flexibly adapted to enable a variety of power management scenarios and/or topologies.

In one aspect, an ETIC is provided. The ETIC includes a first voltage output and a second voltage output each coupled to a power amplifier configured to amplify an RF signal to an output power. The ETIC also includes a first voltage circuit configured to generate a first ET voltage at the first voltage output. The ETIC also includes a second voltage circuit configured to generate a second ET voltage at the second voltage output. The ETIC also includes a control circuit. The control circuit is configured to determine whether the power amplifier is one of a selected set of power amplifiers. The control circuit is also configured to cause the second voltage circuit to generate the second ET voltage lower than or equal to the first ET voltage in response to determining that the power amplifier is one of the selected set of power amplifiers.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
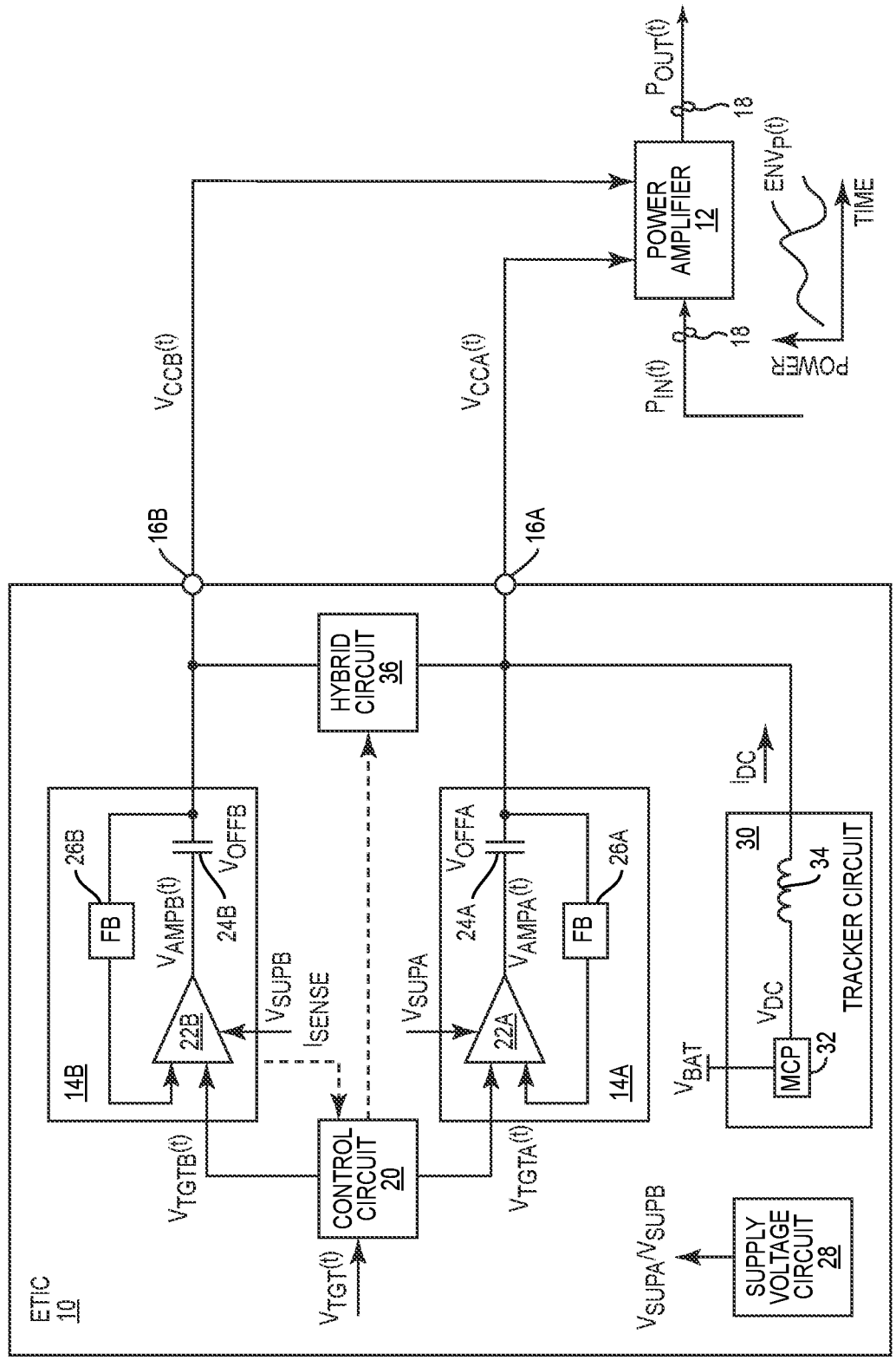
FIG. 1 is a schematic diagram of an exemplary envelope tracking (ET) integrated circuit (ETIC) configured according to various embodiments of the present disclosure to support different types of power amplifiers.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) integrated circuit (ETIC) operable with multiple types of power amplifiers. The ETIC is configured to provide one or more ET voltages to a power amplifier(s) for amplifying a radio frequency (RF) signal. In embodiments disclosed herein, the ETIC can be configured to generate the ET voltages at same or different voltage levels based on specific types of the power amplifier(s), such as multi-stage power amplifier and Doherty power amplifier, and for a wider modulation bandwidth of the RF signal. As such, the ETIC can be flexibly adapted to enable a variety of power management scenarios and/or topologies.

In this regard, FIG. 1 is a schematic diagram of an exemplary ETIC 10 configured according to various embodiments of the present disclosure to support a power amplifier(s) 12 of different types. Although FIG. 1 shows only one of the power amplifier(s) 12, it should be appreciated that the ETIC 10 can support additional power amplifiers, either concurrently or independently.

The ETIC 10 includes a first voltage circuit 14A and a second voltage circuit 14B. The first voltage circuit 14A can be configured to generate a first ET voltage $V_{CCA}(t)$ at a first voltage output 16A and the second voltage circuit 14B can be configured to generate a second ET voltage $V_{CCB}(t)$ at a second voltage output 16B. The power amplifier(s) 12 is coupled to the first voltage output 16A and the second voltage output 16B and configured to amplify an RF signal 18 from an input power $P_{IN}(t)$ to an output power $P_{OUT}(t)$ based on one or more of the first ET voltage $V_{CCA}(t)$ and the second ET voltage $V_{CCB}(t)$.

The ETIC 10 further includes a control circuit 20, which can be a field-programmable gate array (FPGA), as an example. The control circuit 20 may cause the first voltage circuit 14A and/or the second voltage circuit 14B to adapt the first ET voltage $V_{CCA}(t)$ and/or the second ET voltage $V_{CCB}(t)$ base on specific types of the power amplifier(s) 12. As discussed in detail below, the control circuit 20 determines whether the power amplifier(s) 12 is one of a selected set of power amplifiers. If the power amplifier(s) 12 is one of the selected set of power amplifiers, the control circuit 20 can cause the second ET voltage $V_{CCB}(t)$ to be generated lower than or equal to the first ET voltage $V_{CCA}(t)$. In contrast, if the power amplifier(s) 12 is not among the selected set of power amplifiers, the control circuit 20 can further cause the ETIC 10 to generate the first ET voltage $V_{CCA}(t)$ and/or the second ET voltage $V_{CCB}(t)$ accordingly. As such, it is possible to flexibly configure the ETIC 10 to enable a variety of power management scenarios and/or topologies.

The first voltage circuit 14A includes a first voltage amplifier 22A and a first offset capacitor 24A. The first voltage amplifier 22A is configured to generate a first initial ET voltage $V_{AMPA}(t)$ based on a first supply voltage $V_{SUPA}$. The first offset capacitor 24A is coupled between the first voltage amplifier 22A and the first voltage output 16A. The first offset capacitor 24A is configured to raise the first initial ET voltage $V_{AMPA}(t)$ by a first offset voltage $V_{OFFA}$ (e.g., 0.8 V) to generate the first ET voltage $V_{CCA}(t)$ at the first voltage output 16A. The first voltage circuit 14A also includes a first feedback loop 26A (denoted as "FB") that provides a feedback of the first ET voltage $V_{CCA}(t)$ to the first voltage amplifier 22A and thereby makes the first voltage circuit 14A a closed-loop ET voltage circuit. Notably, the first voltage amplifier 22A is configured to generate the first initial ET voltage $V_{AMPA}(t)$ that tracks (e.g., rises and falls) a first ET target voltage $V_{TGTA}(t)$ over time. In this regard, it is possible to increase or decrease the first initial ET voltage $V_{AMPA}(t)$, and therefore the first ET voltage $V_{CCA}(t)$, by increasing or decreasing the first ET target voltage $V_{TGTA}(t)$.

The second voltage circuit 14B includes a second voltage amplifier 22B and a second offset capacitor 24B. In a non-limiting example, the second offset capacitor 24B has a smaller capacitance than the first offset capacitor 24A. The second voltage amplifier 22B is configured to generate a second initial ET voltage $V_{AMPB}(t)$ based on a second supply voltage $V_{SUPB}$. The second offset capacitor 24B is coupled between the second voltage amplifier 22B and the second voltage output 16B. The second offset capacitor 24B is configured to raise the second initial ET voltage $V_{AMPB}(t)$ by a second offset voltage $V_{OFFB}$ (e.g., 0.8 V) to generate the second ET voltage $V_{CCB}(t)$ at the second voltage output 16B. The second voltage circuit 14B also includes a second feedback loop 26B (denoted as "FB") that provides a feedback of the second ET voltage $V_{CCB}(t)$ to the second voltage amplifier 22B and thereby makes the second voltage circuit 14B a closed-loop ET voltage circuit. Notably, the second voltage amplifier 22B is configured to generate the second initial ET voltage $V_{AMPB}(t)$ that tracks (e.g., rises and falls) a second ET target voltage $V_{TGTB}(t)$ over time. In this regard, it is possible to increase or decrease the second initial ET voltage $V_{AMPB}(t)$, and therefore the second ET voltage $V_{CCB}(t)$, by increasing or decreasing the second ET target voltage $V_{TGTB}(t)$.

The ETIC 10 may include a supply voltage circuit 28. The supply voltage circuit 28 can be configured to generate the first supply voltage $V_{SUPA}$ and the second supply voltage $V_{SUPB}$.

The control circuit 20 may receive a time-variant ET target voltage $V_{TGT}(t)$ from a transceiver circuit (not shown) that generates the RF signal 18. The time-variant ET target voltage $V_{TGT}(t)$ is so generated to track a time-variant power envelope $ENV_P(t)$ of the RF signal 18. In embodiments disclosed herein, the control circuit 20 may be configured to generate both the first ET target voltage $V_{TGTA}(t)$ and the second ET target voltage $V_{TGTB}(t)$ from the time-variant ET target voltage $V_{TGT}(t)$.

In a non-limiting example, the control circuit 20 can generate the first ET target voltage $V_{TGTA}(t)$ based on a first analog lookup table (LUT) that correlates the time-variant ET target voltage $V_{TGT}(t)$ with the first ET target voltage $V_{TGTA}(t)$. Likewise, the control circuit 20 may generate the second ET target voltage $V_{TGTB}(t)$ based on a first LUT that correlates the time-variant ET target voltage $V_{TGT}(t)$ with the second ET target voltage $V_{TGTB}(t)$. Notably, the first analog LUT may be the same as or different from the second analog LUT. As a result, the control circuit 20 can have more flexibility with respect to adapting the first ET target voltage $V_{CCA}(t)$ and/or the second ET target voltage $V_{CCB}(t)$ based on the output power $P_{OUT}(t)$ of the RF signal 18.

The ETIC 10 further includes a tracker circuit 30 that includes a multi-level charge pump 32 (denoted as "MCP") and a power inductor 34. The multi-level charge pump 32 is configured to generate a low-frequency voltage $V_{DC}$ based on a battery voltage $V_{BAT}$. The power inductor 34 is coupled between the multi-level charge pump 32 and the first voltage output 16A. The power inductor 34 is configured to induce a low-frequency current $I_{DC}$ based on the low-frequency voltage $V_{DC}$ and provide the low-frequency current $I_{DC}$ to the first voltage output 16A.

The ETIC 10 further includes a hybrid circuit 36 that is coupled between the first voltage output 16A and the second voltage output 16B. In embodiments disclosed herein, the hybrid circuit 36 may be controlled by the control circuit 20 to operate as a closed switch, an open switch, or a low dropout (LDO) regulator. When operating as the closed switch, the hybrid circuit 36 passes the low-frequency current $I_{DC}$ from the first voltage output 16A to the second voltage output 16B. When operating as the open switch, the hybrid circuit 36 blocks the low-frequency current $I_{DC}$ from the second voltage output 16B. When operating as the LDO regulator, the hybrid circuit 36 regulates (e.g., reduces) the low-frequency current $I_{DC}$ at the second voltage output 16B.

In a non-limiting example, the second voltage circuit 14B may generate a sense current $I_{SENSE}$ to indicate a current surplus or deficit at the second voltage output 16B. Accordingly, the control circuit 20 can determine how much of the low-frequency current $I_{DC}$ needs to be forwarded to the second voltage output 16B based on the sense current $I_{SENSE}$ generated by the second voltage circuit 14B.

In one embodiment, the selected set of power amplifiers includes a multi-stage power amplifier. In this regard, FIG. 2 is a schematic diagram of an exemplary multi-stage power amplifier 38, which can be provided in the ETIC 10 of FIG. 1 as the power amplifier(s) 12.

In a non-limiting example, the multi-stage power amplifier 38 includes a driver stage amplifier 40 and an output stage amplifier 42 that collectively amplify the RF signal 18 from the input power $P_{IN}(t)$ to the output power $P_{OUT}(t)$. The driver stage amplifier 40 operates based on a driver voltage $V_D(t)$ and the output stage amplifier 42 operates based on an output voltage $V_O(t)$ that is typically higher than the driver voltage $V_D(t)$. Given that the driver stage amplifier 40 is placed in front of the output stage amplifier 42, the RF signal 18 received by the output stage amplifier 42 will be delayed by a temporal delay $\Delta T$ relative to the RF signal 18 received by the driver stage amplifier 40.

Figure 2:
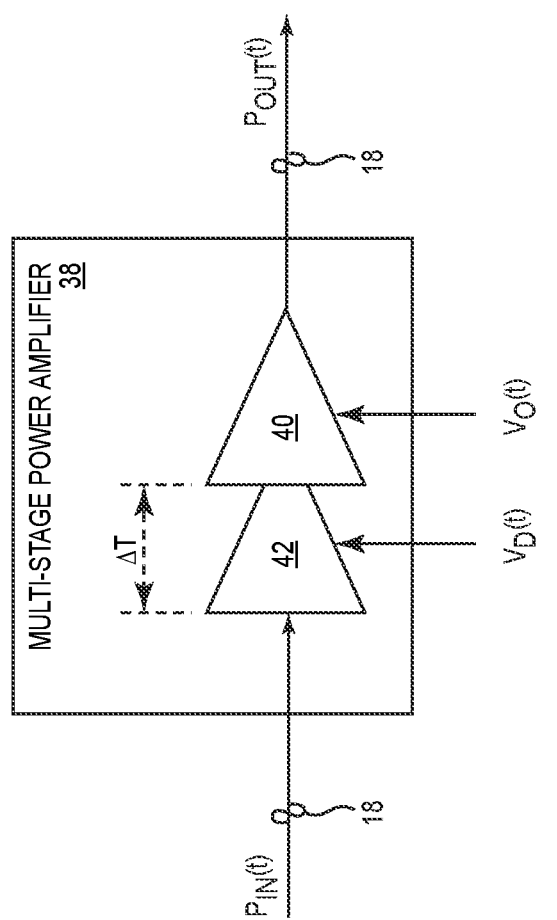
FIG. 2 is a schematic diagram of an exemplary multi-stage power amplifier, which can be provided in the ETIC of FIG. 1 as one of the different types of power amplifiers.
Figure 3:
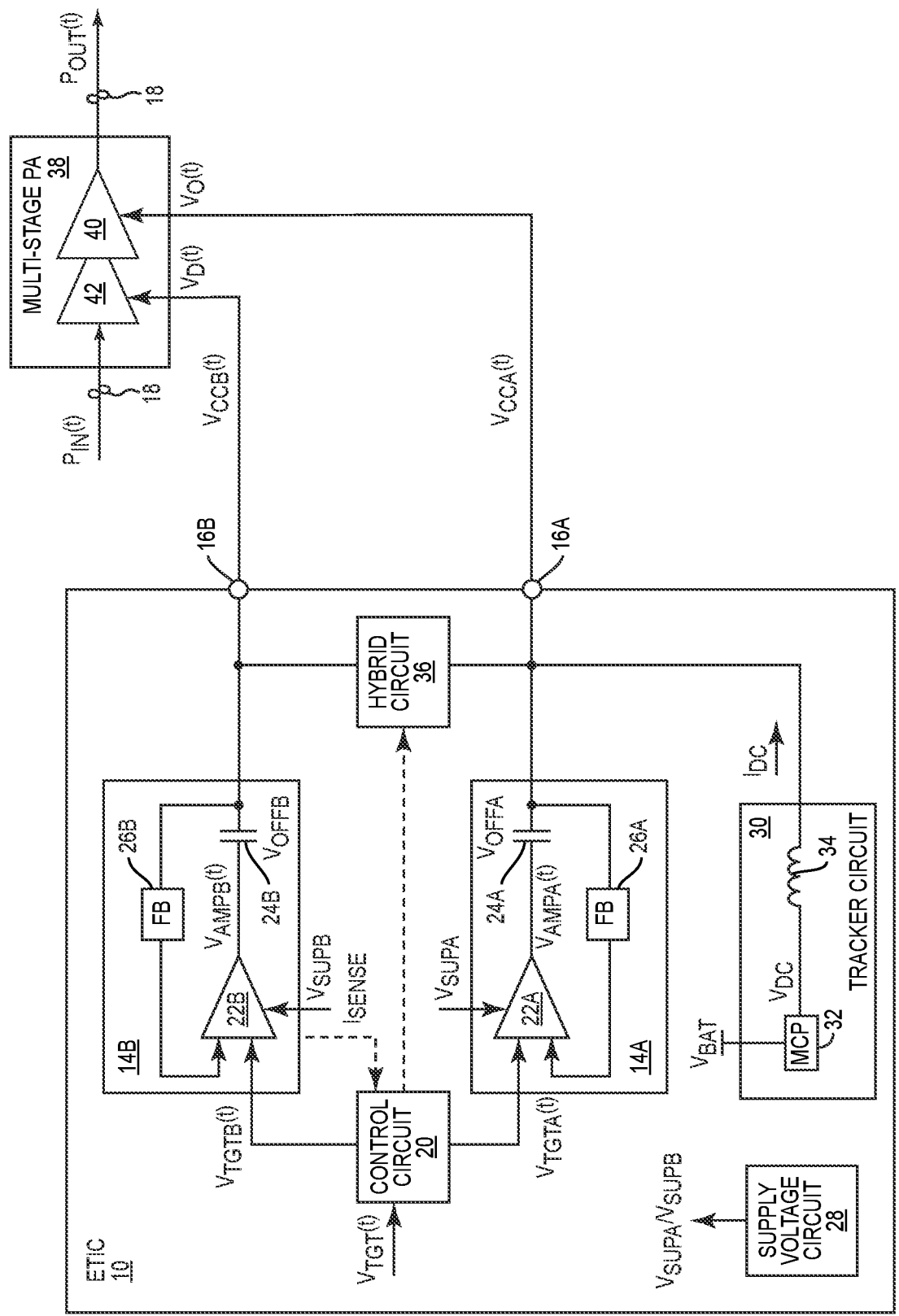
FIG. 3 is a schematic diagram providing an exemplary illustration of the ETIC of FIG. 1 adapted to support the multi-stage power amplifier of FIG. 2.

FIG. 3 is a schematic diagram providing an exemplary illustration of the ETIC 10 of FIG. 1 adapted to support the multi-stage power amplifier 38 of FIG. 2. Common elements between FIGS. 1, 2 and 3 are shown therein with common element numbers and will not be re-described herein.

In one embodiment, the output stage amplifier 42 is coupled to the first voltage output 16A and the driver stage amplifier 40 is coupled to the second voltage output 16B. In this regard, the output stage amplifier 42 receives the first ET voltage $V_{CCA}(t)$ as the output voltage $V_O(t)$ and the driver stage amplifier 40 receives the second ET voltage $V_{CCB}(t)$ as the driver voltage $V_D(t)$.

As mentioned earlier, the output voltage $V_O(t)$ is typically higher than the driver voltage $V_D(t)$. As such, the control circuit 20 is configured to generate the first ET target voltage $V_{TGTA}(t)$ and the second ET target voltage $V_{TGTB}(t)$ to thereby cause the first ET voltage $V_{CCA}(t)$ to always be generated higher than the second ET voltage $V_{CCB}(t)$. In a non-limiting example, the control circuit 20 can cause the first ET voltage $V_{CCA}(t)$ to always be generated higher than the second ET voltage $V_{CCB}(t)$ when the RF signal 18 is modulated to a wide modulation bandwidth (e.g., ≥200 MHz).

Notably, by generating the first ET voltage $V_{CCA}(t)$ to always be higher than the second ET voltage $V_{CCB}(t)$, it is possible to drive the low-frequency current $I_{DC}$ from the first voltage output 16A toward the second voltage output 16B. As such, the control circuit 20 may control the hybrid circuit 36 to operate as the LDO regulator to regulate the low-frequency current $I_{DC}$ that flows from the first voltage output 16A toward the second voltage output 16B.

As discussed in FIG. 2, the RF signal 18 may be delayed by the temporal delay $\Delta T$ when it arrives at the output stage amplifier 42. In this regard, the control circuit 20 may be further configured to determine the temporal delay $\Delta T$ (e.g., based on configuration) and generate the first ET target voltage $V_{TGTA}(t)$ with the temporal delay $\Delta T$ relative to the second ET target voltage $V_{TGTB}(t)$. In other words, the first ET target voltage $V_{TGTA}(t)$ will be delayed from the second ET target voltage $V_{TGTB}(t)$ by the temporal delay $\Delta T$. As a result, the first ET voltage $V_{CCA}(t)$ will be delayed from the second ET voltage $V_{CCB}(t)$ by the determined temporal delay $\Delta T$ to ensure proper alignment to the time-variant power envelope $ENV_P(t)$ of the RF signal 18.

Figure 4A:
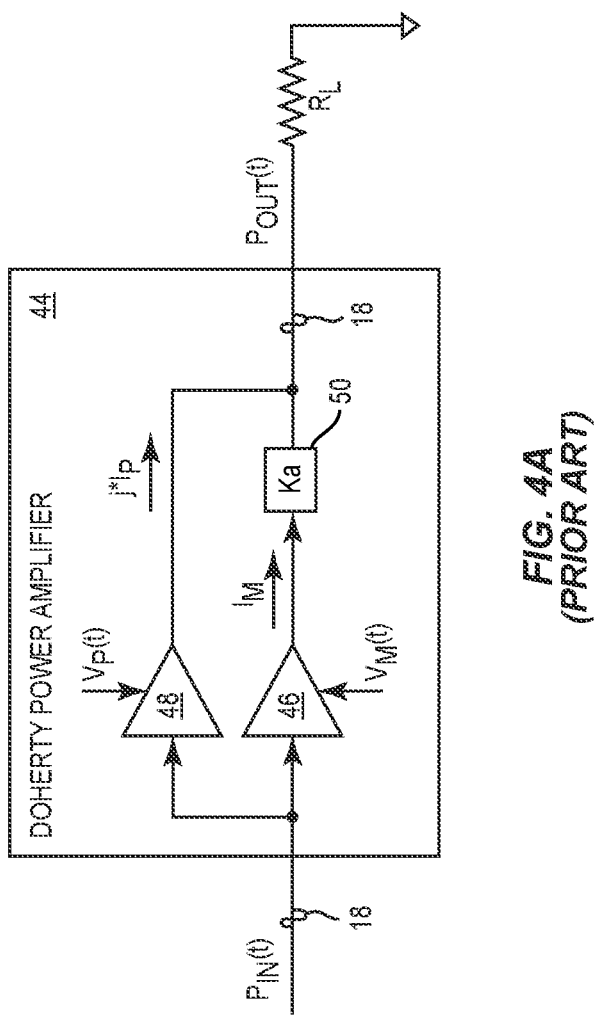
FIG. 4A is a schematic diagram of an exemplary Doherty power amplifier, which can be provided in the ETIC of FIG. 1 as one of the different types of power amplifiers.

In another embodiment, the selected set of power amplifiers includes a Doherty power amplifier. In this regard, FIG. 4A is a schematic diagram of an exemplary Doherty power amplifier 44, which can be provided in the ETIC 10 of FIG. 1 as the power amplifier(s) 12. Common elements between FIGS. 1 and 4A are shown therein with common element numbers and will not be re-described herein.

The Doherty power amplifier 44 includes a carrier amplifier 46 and a peaking amplifier 48. In a non-limiting example, the carrier amplifier 46 is coupled to a load $R_L$ (e.g., an antenna port) via an impedance inverter 50 (denoted as "Ka"). The carrier amplifier 46 is associated with a carrier current $I_M$ and configured to amplify the RF signal 18 based on a carrier voltage $V_M(t)$. The peaking amplifier 48 is associated with a peaking current $j*I_P$ and configured to amplify the RF signal 18 based on a peaking voltage $V_P(t)$.

Figure 4B:
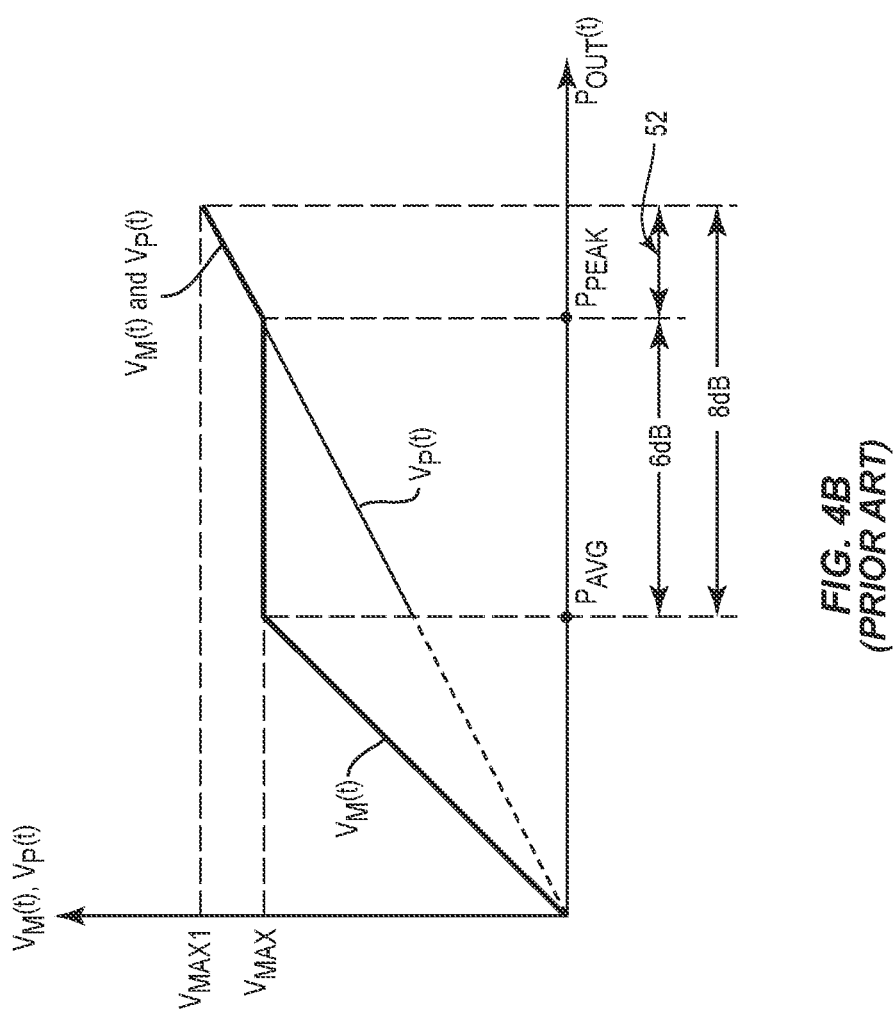
FIG. 4B is a graphic diagram providing an exemplary illustration of operating principles of the Doherty power amplifier in FIG. 4A.

FIG. 4B is a graphic diagram providing an exemplary illustration of operating principles of the Doherty power amplifier 44 in FIG. 4A. Assuming that the RF signal 18 has a peak-to-average ratio (PAR) of 6 dB, when the output power $P_{OUT}(t)$ is below an average power $P_{AVG}$ of the output power $P_{OUT}(t)$, which corresponds to one-half ($\frac{1}{2}$) of the output power $P_{OUT}(t)$, the carrier amplifier 46 is activated while the peaking amplifier 48 is deactivated. Accordingly, the carrier amplifier 46 amplifies the RF signal 18 from the input power $P_{IN}(t)$ to the output power $P_{OUT}(t)$ based on the carrier voltage $V_M(t)$. When the output power $P_{OUT}(t)$ is in between of the average power $P_{AVG}$ and a peak power $P_{PEAK}$ of the output power $P_{OUT}(t)$, the carrier amplifier 46 continues to amplify the RF signal 18 based on the carrier voltage $V_M(t)$, which is maintained at a maximum voltage $V_{MAX}$. In the meantime, the peaking amplifier 48 is also activated to amplify the RF signal 18 based on the peaking voltage $V_P(t)$.

As shown in FIG. 4B, before the output power $P_{OUT}(t)$ reaches the peak power $P_{PEAK}$, the carrier voltage $V_M(t)$ is higher than the peaking voltage $V_P(t)$. However, when the output power $P_{OUT}(t)$ reaches the peak power $P_{PEAK}$, the carrier voltage $V_M(t)$ and the peaking voltage $V_P(t)$ become equal. In this regard, for the PAR of 6 dB, it can be said that the carrier voltage $V_M(t)$ is greater than or equal to the peaking voltage $V_P(t)$.

Assuming now that the RF signal 18 has a PAR of 8 dB, the output power $P_{OUT}(t)$ is higher than the peak power $P_{PEAK}$ in a region 52. In this regard, the carrier volage $V_M(t)$ and the peaking voltage $V_P(t)$ will be increased concurrently and equally toward a higher maximum voltage $V_{MAX1}$. Accordingly, the carrier amplifier 46 and the peaking amplifier 48 are both activated to amplify the RF signal 18.

Several operating principles of the Doherty power amplifier 44 can be observed from FIG. 4B. First, it can be observed that only the carrier voltage $V_M(t)$ is needed when the output power $P_{OUT}(t)$ is below the average power $P_{AVG}$. Second, it can be observed that the carrier voltage $V_M(t)$ is always higher than the peaking voltage $V_P(t)$ when the output power $P_{OUT}(t)$ is higher than the average power $P_{AVG}$ but lower than the peak power $P_{PEAK}$. Third, it can be further observed that the carrier voltage $V_M(t)$ equals the peaking voltage $V_P(t)$ when the output power $P_{OUT}(t)$ is higher than or equal to the peak power $P_{PEAK}$. As discussed below in FIG. 5, it is possible to adapt the ETIC 10 of FIG. 1 to support the Doherty power amplifier 44 of FIG. 4A based on the operating principles observed in FIG. 4B.

Figure 5:
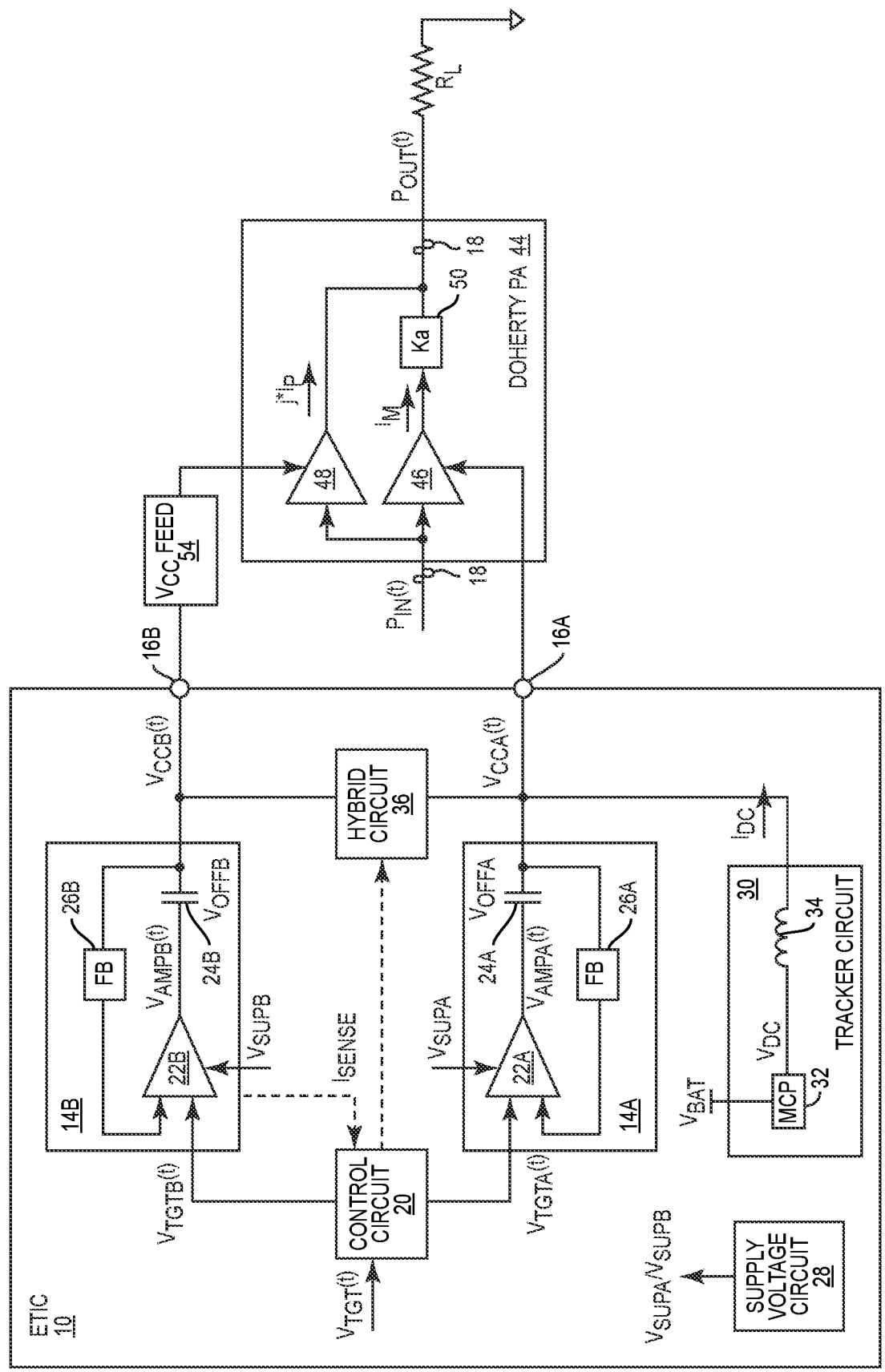
FIG. 5 is a schematic diagram providing an exemplary illustration of the ETIC of FIG. 1 adapted to support the Doherty power amplifier of FIG. 4A.

In this regard, FIG. 5 is a schematic diagram providing an exemplary illustration of the ETIC 10 of FIG. 1 adapted to support the Doherty power amplifier 44 of FIG. 4A. Common elements between FIGS. 1, 4A, 4B, and 5 are shown therein with common element numbers and will not be re-described herein.

In this embodiment, the carrier amplifier 46 is coupled to the first voltage output 16A to receive the first ET target voltage $V_{TGTA}(t)$. The peak amplifier 48 is coupled to the second voltage output 16B via a voltage feeder circuit 54 (denoted as "$V_{CC}$ feed"). The voltage feeder circuit 54 is configured to introduce a 90° phase shift in the second ET target voltage $V_{TGTB}(t)$.

In accordance with the operating principles observed in FIG. 4B, the control circuit 20 activates the first voltage circuit 14A and deactivates the second voltage circuit 14B when the control circuit 20 determines that the output power $P_{OUT}(t)$ of the RF signal 18 is lower than the average power $P_{AVG}$ of the RF signal 18. The control circuit 20 may also control the hybrid circuit 36 to operate as the open switch to thereby block the low-frequency current $I_{DC}$ from the second voltage output 16B.

When the control circuit 20 determines that the output power $P_{OUT}(t)$ is higher than or equal to the average power $P_{AVG}$ of the RF signal 18, the control circuit 20 activates the second voltage circuit 14B. More specifically, if the control circuit 20 determines that the output power $P_{OUT}(t)$ is lower than or equal to the peak power $P_{PEAK}$ (e.g., 6 dB PAR), the control circuit 20 controls the first voltage circuit 14A to maintain the first ET voltage $V_{CCA}(t)$ at a peak ET voltage level $V_{CC-MAX}$ (e.g., 5.5 V). Concurrently, the control circuit 20 controls the second voltage circuit 14B to generate the second ET voltage $V_{CCB}(t)$ lower than the ET voltage $V_{CCA}(t)$. By keeping the first ET voltage $V_{CCA}(t)$ higher than the second ET voltage $V_{CCB}(t)$, the low-frequency current $I_{DC}$ can flow from the first voltage output 16A toward the second voltage output 16B. The control circuit 20 may control the hybrid circuit 36 to operate as the LDO regulator to regulate the low-frequency current $I_{DC}$ that flows from the first voltage output 16A toward the second voltage output 16B. In a non-limiting example, the control circuit 20 can increase or decrease the low-frequency current $I_{DC}$ based on the sense current $I_{SENSE}$ generated by the second voltage circuit 14B.

The first ET voltage $V_{CCA}(t)$ and the second ET voltage $V_{CCB}(t)$ will become equal when the output power $P_{OUT}(t)$ reaches the peak power $P_{PEAK}$. As a result, the carrier amplifier 46 and the peaking amplifier 48 each produces $\frac{1}{2}$ of the peak power $P_{PEAK}$.

When the control circuit 20 determines that the output power $P_{OUT}(t)$ is higher than the peak power $P_{PEAK}$ (e.g., 8 dB PAR), the control circuit 20 may control the first voltage circuit 14A and the second voltage circuit 14B to increase the first ET voltage $V_{CCA}(t)$ and the second ET voltage $V_{CCB}(t)$, respectively, to a higher peak ET voltage level $V_{CC-MAX1}$ ($V_{CC-MAX1} > V_{CC-MAX}$). Accordingly, the control circuit 20 may control the hybrid circuit 36 to operate as the closed switch.

The control circuit 20 may further determine whether there exists the temporal delay $\Delta T$ between the carrier amplifier 46 and the peaking amplifier 48. If the control circuit 20 determines that such temporal delay $\Delta T$ exists, for example in the peaking amplifier 48, the control circuit 20 may generate the second ET target voltage $V_{TGTB}(t)$ with the determined temporal delay $\Delta T$ relative to the first ET target voltage $V_{TGTA}(t)$ to thereby cause the second ET voltage $V_{CCB}(t)$ to be delayed by the determined temporal delay $\Delta T$.

Figure 6A:
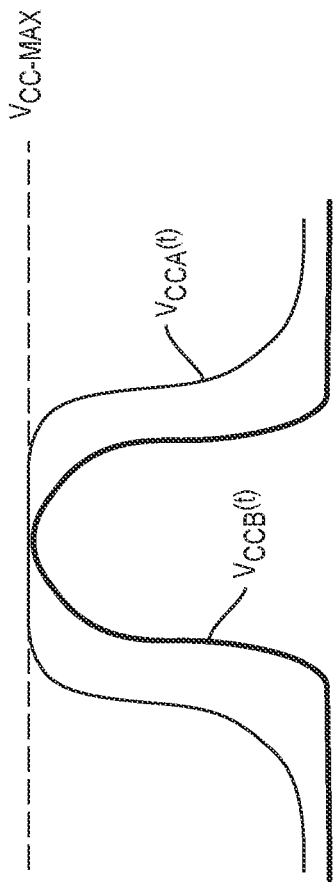
FIGS. 6A and 6B are graphic diagrams illustrating operating principles of the ETIC in FIG. 5.
Figure 6B:
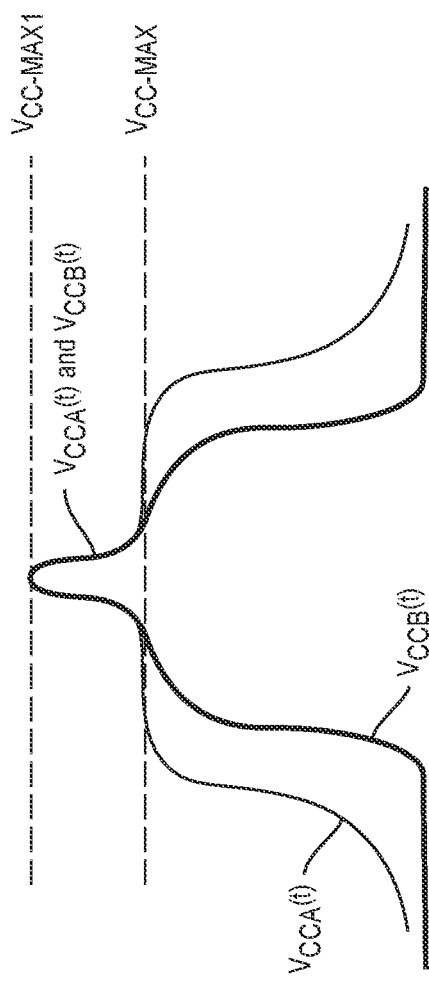

FIGS. 6A and 6B are graphic diagrams illustrating operating principles of the ETIC 10 in FIG. 5. Specifically, FIG. 6A illustrates operation of the ETIC 10 when the RF signal 18 is associated with the 6 dB PAR, and FIG. 6B illustrates operation of the ETIC 10 when the RF signal 18 is associated with the 8 dB PAR.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (ETIC) comprising:
    a first voltage output and a second voltage output each coupled to a power amplifier configured to amplify a radio frequency (RF) signal to an output power;
    a first voltage circuit configured to generate a first ET voltage at the first voltage output based on a first ET target voltage;
    a second voltage circuit configured to generate a second ET voltage at the second voltage output based on a second ET target voltage; and
    a control circuit configured to:
        receive a time-variant ET target voltage that tracks a time-variant power envelope of the RF signal;
        determine whether the power amplifier is one of a selected set of power amplifiers; and
        generate the first ET target voltage and the second ET target voltage based on the time-variant ET target voltage to thereby cause the second voltage circuit to generate the second ET voltage lower than or equal to the first ET voltage in response to determining that the power amplifier is one of the selected set of power amplifiers.

2. The ETIC of claim 1 wherein the control circuit is further configured to:
    generate the first ET target voltage based on a first analog lookup table (LUT) that correlates the time-variant ET target voltage with the first ET target voltage; and
    generate the first ET target voltage based on a second analog LUT that correlates the time-variant ET target voltage with the second ET target voltage.

3. The ETIC of claim 1 further comprising:
    a tracker circuit configured to provide a low-frequency current to the first voltage output; and
    a hybrid circuit coupled between the first voltage output and the second voltage output and configured to:
        operate as a closed switch to pass the low-frequency current from the first voltage output to the second voltage output;
        operate as an open switch to block the low-frequency current from the second voltage output; and
        operate as a low dropout (LDO) regulator to regulate the low-frequency current at the second voltage output.

4. The ETIC of claim 3 wherein the selected set of power amplifiers comprises a multi-stage power amplifier comprising a driver stage amplifier coupled to the second voltage output and an output stage amplifier coupled to the first voltage output.

5. The ETIC of claim 4 wherein the RF signal is modulated at a wide modulation bandwidth.

6. The ETIC of claim 4 wherein the control circuit is further configured to cause the hybrid circuit to operate as the LDO regulator.

7. The ETIC of claim 6 wherein the control circuit is further configured to cause the second voltage circuit to generate the second ET voltage lower than the first ET voltage to thereby drive the low-frequency current from the first voltage output toward the second voltage output.

8. The ETIC of claim 4 wherein the control circuit is further configured to:
    determine a temporal delay between the driver stage amplifier and the output stage amplifier; and
    generate the first ET target voltage with the determined temporal delay relative to the second ET target voltage to thereby cause the first ET voltage to be delayed from the second ET voltage by the determined temporal delay.

9. The ETIC of claim 3 wherein the selected set of power amplifiers comprises a Doherty power amplifier comprising a carrier amplifier coupled to the first voltage output and a peaking amplifier coupled to the second voltage output.

10. The ETIC of claim 9 wherein the control circuit is further configured to activate the first voltage circuit and deactivate the second voltage circuit in response to determining that the output power is lower than an average power of the RF signal.

11. The ETIC of claim 10 wherein the control circuit is further configured to cause the hybrid circuit to operate as the open switch.

12. The ETIC of claim 9 wherein the control circuit is further configured to activate the first voltage circuit and the second voltage circuit to generate the first ET voltage and the second ET voltage, respectively, in response to determining that the output power is higher than or equal to an average power of the RF signal.

13. The ETIC of claim 12 wherein, in response to determining that the output power is lower than or equal to a peak power of the RF signal, the control circuit is further configured to:
    cause the first voltage circuit to generate the first ET voltage at a peak ET voltage level; and
    cause the second voltage circuit to generate the second ET voltage lower than the peak ET voltage level.

14. The ETIC of claim 13 wherein the control circuit is further configured to cause the hybrid circuit to operate at the LDO regulator.

15. The ETIC of claim 14 wherein the control circuit is further configured to control the hybrid circuit to regulate the low-frequency current based on a sense current generated by the second voltage circuit.

16. The ETIC of claim 13 wherein, in response to determining that the output power is higher than a peak power of the RF signal, the control circuit is further configured to:
    cause the first voltage circuit to increase the first ET voltage above the peak ET voltage level; and
    cause the second voltage circuit to increase the second ET voltage above the peak ET voltage level.

17. The ETIC of claim 16 wherein the control circuit is further configured to cause the hybrid circuit to operate as the closed switch.

18. The ETIC of claim 12 wherein the control circuit is further configured to:
    determine a temporal delay between the carrier amplifier and the peaking amplifier; and
    generate the second ET target voltage with the determined temporal delay to thereby cause the second ET voltage to be delayed from the first ET voltage by the determined temporal delay.

19. A wireless device comprising an envelope tracking (ET) integrated circuit (ETIC), the ETIC comprises:
- a first voltage output and a second voltage output each coupled to a power amplifier configured to amplify a radio frequency (RF) signal to an output power;
- a first voltage circuit configured to generate a first ET voltage at the first voltage output based on a first ET target voltage;
- a second voltage circuit configured to generate a second ET voltage at the second voltage output based on a second ET target voltage; and
- a control circuit configured to:
  - receive a time-variant ET target voltage that tracks a time-variant power envelope of the RF signal;
  - determine whether the power amplifier is one of a selected set of power amplifiers; and
  - generate the first ET target voltage and the second ET target voltage based on the time-variant ET target voltage to thereby cause the second voltage circuit to generate the second ET voltage lower than or equal to the first ET voltage in response to determining that the power amplifier is one of the selected set of power amplifiers.

* * * * *